US011152575B2

(12) United States Patent
Wada et al.

(10) Patent No.: US 11,152,575 B2
(45) Date of Patent: Oct. 19, 2021

(54) PHOTOELECTRIC CONVERSION ELEMENT AND RADIATION DETECTOR

(71) Applicant: Kabushiki Kaisha Toshiba, Minato-ku (JP)

(72) Inventors: Atsushi Wada, Kawasaki (JP); Isao Takasu, Setagaya (JP); Rei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 342 days.

(21) Appl. No.: 15/906,243

(22) Filed: Feb. 27, 2018

(65) Prior Publication Data

US 2019/0173018 A1 Jun. 6, 2019

(30) Foreign Application Priority Data

Dec. 4, 2017 (JP) .............................. JP2017-232857

(51) Int. Cl.
*H01L 51/42* (2006.01)
*H01L 51/00* (2006.01)
(Continued)

(52) U.S. Cl.
CPC .......... *H01L 51/0072* (2013.01); *G01T 1/208* (2013.01); *G01T 1/2018* (2013.01);
(Continued)

(58) Field of Classification Search
CPC ............. H01L 51/0072; H01L 51/0035; H01L 51/0037; H01L 27/308; H01L 27/305; G01T 1/208; G01T 1/2018
See application file for complete search history.

(56) References Cited

U.S. PATENT DOCUMENTS

| 2009/0050881 | A1* | 2/2009 | Hayashi | ................. | B82Y 10/00 |
|---|---|---|---|---|---|
| | | | | | 257/40 |
| 2012/0241628 | A1* | 9/2012 | Hesser | ................. | G01T 1/2018 |
| | | | | | 250/362 |
| 2019/0035956 | A1 | 1/2019 | Wada et al. | | |

FOREIGN PATENT DOCUMENTS

| CN | 103026261 A | 4/2013 |
|---|---|---|
| JP | 2007-180190 | 7/2007 |

(Continued)

OTHER PUBLICATIONS

Scharber et al. Design rules for donors in bulk-heterojunction solar cells—towards 10% energy-conversion efficiency, Advanced Materials, vol. 18, No. 6, pp. 789-794 (Year: 2006).*

(Continued)

*Primary Examiner* — David P Porta
*Assistant Examiner* — Shun Lee
(74) *Attorney, Agent, or Firm* — Oblon, McClelland, Maier & Neustadt, L.L.P.

(57) ABSTRACT

According to one embodiment, a photoelectric conversion element includes a first conductive layer, a second conductive layer, and an intermediate layer provided between the first conductive layer and the second conductive layer. The intermediate layer includes a first semiconductor region and a second semiconductor region. The first semiconductor region is of an n-type, and the second semiconductor region is of a p-type. The first semiconductor region includes at least one selected from the group consisting of fullerene and a fullerene derivative. The second semiconductor region includes at least one selected from the group consisting of quinacridone and a quinacridone derivative. A ratio of a weight of the second semiconductor region per unit volume to a weight of the first semiconductor region per unit volume in the intermediate layer is greater than 5.

12 Claims, 5 Drawing Sheets

(51) Int. Cl.
    *H01L 27/30*    (2006.01)
    *G01T 1/20*     (2006.01)
    *G01T 1/208*    (2006.01)
    *H01L 51/44*    (2006.01)

(52) U.S. Cl.
    CPC .......... *H01L 27/305* (2013.01); *H01L 27/308* (2013.01); *H01L 51/0035* (2013.01); *H01L 51/0037* (2013.01); H01L 51/0046 (2013.01); H01L 51/0047 (2013.01); H01L 51/0071 (2013.01); H01L 51/4253 (2013.01); H01L 51/441 (2013.01); H01L 2251/552 (2013.01)

(56) References Cited

FOREIGN PATENT DOCUMENTS

| JP | 2011-124567   | 6/2011  |
|----|---------------|---------|
| JP | 2012-4578 A   | 1/2012  |
| JP | 2014-209535   | 11/2014 |
| JP | 2017-59689    | 3/2017  |
| JP | 2019-29464 A  | 2/2019  |

OTHER PUBLICATIONS

Li et al. Trap-assisted photomultiplication polymer photodetectors obtaining an external quantum efficiency of 37 500%, ACS Applied Materials & Interfaces vol. 7, No. 10, pp. 5890-5897 (Year: 2015).*
Lingliang Li, et al. "Achieving EQE of 16,700% in P3HT:PC71BM based photodetectors by trap-assisted photomultiplication," Scientific Reports, vol. 5, No. 9181, 2015, pp. 7.

* cited by examiner

PHOTOELECTRIC CONVERSION ELEMENT AND RADIATION DETECTOR

CROSS-REFERENCE TO RELATED APPLICATIONS

This application is based upon and claims the benefit of priority from Japanese Patent Application No. 2017-232857, filed on Dec. 4, 2017; the entire contents of which are incorporated herein by reference.

FIELD

Embodiments described herein relate generally to a photoelectric conversion element and a radiation detector.

BACKGROUND

For example, there is a photoelectric conversion element that uses an organic semiconductor material. There is a radiation detector that uses the photoelectric conversion element. It is desirable to increase the sensitivity of the photoelectric conversion element.

DETAILED DESCRIPTION

According to one embodiment, a photoelectric conversion element includes a first conductive layer, a second conductive layer, and an intermediate layer provided between the first conductive layer and the second conductive layer. The intermediate layer includes a first semiconductor region and a second semiconductor region. The first semiconductor region is of an n-type, and the second semiconductor region is of a p-type. The first semiconductor region includes at least one selected from the group consisting of fullerene and a fullerene derivative. The second semiconductor region includes at least one selected from the group consisting of quinacridone and a quinacridone derivative. A ratio of a weight of the second semiconductor region per unit volume to a weight of the first semiconductor region per unit volume in the intermediate layer is greater than 5.

According to another embodiment, a photoelectric conversion element includes a first conductive layer, a second conductive layer, and an intermediate layer provided between the first conductive layer and the second conductive layer. The intermediate layer includes a first semiconductor region and a second semiconductor region. The first semiconductor region is of an n-type, and the second semiconductor region being of a p-type. The first semiconductor region has a first highest occupied molecular orbit and a first lowest unoccupied molecular orbit. The second semiconductor region has a second highest occupied molecular orbit and a second lowest unoccupied molecular orbit. The absolute value of a difference between the second highest occupied molecular orbit and the first lowest unoccupied molecular orbit is 1.0 eV or more. The absolute value of a difference between the second lowest unoccupied molecular orbit and the first lowest unoccupied molecular orbit is 1.3 eV or more. A ratio of a weight of the second semiconductor region per unit volume to a weight of the first semiconductor region per unit volume in the intermediate layer is greater than 5.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1A:
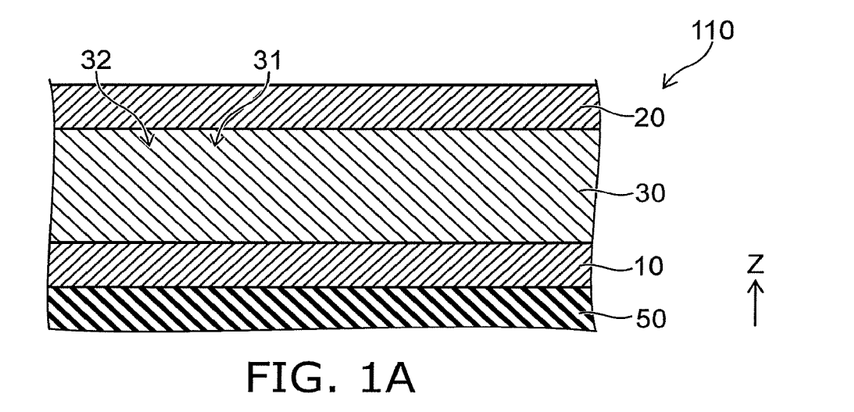
FIG. 1A and FIG. 1B are schematic views illustrating a photoelectric conversion element according to a first embodiment.
Figure 1B:
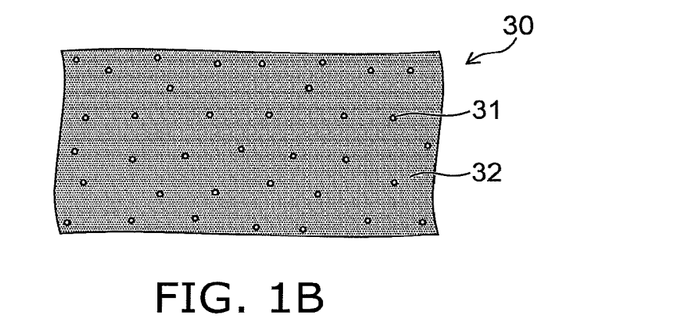

FIG. 1A and FIG. 1B are schematic views illustrating a photoelectric conversion element according to a first embodiment. FIG. 1A is a cross-sectional view. FIG. 1B is a schematic cross-sectional view illustrating a portion of the photoelectric conversion element.

As shown in FIG. 1A, the photoelectric conversion element 110 according to the first embodiment includes a first conductive layer 10, a second conductive layer 20, and an intermediate layer 30.

The intermediate layer 30 is provided between the first conductive layer 10 and the second conductive layer 20. A substrate 50 is provided in the example. The first conductive layer 10 is positioned between the substrate 50 and the intermediate layer 30.

The direction from the first conductive layer 10 toward the second conductive layer 20 is taken as a Z-axis direction. The Z-axis direction is the stacking direction of the first conductive layer 10, the intermediate layer 30, and the second conductive layer 20. These layers spread along a plane substantially perpendicular to the Z-axis direction.

As shown in FIG. 1B, the intermediate layer 30 includes an organic semiconductor material. The intermediate layer 30 includes a first semiconductor region 31 of an n-type, and a second semiconductor region 32 of a p-type.

For example, the first semiconductor region 31 and the second semiconductor region 32 are mixed with each other. For example, the intermediate layer 30 has a bulk heterojunction structure.

The first semiconductor region 31 includes, for example, at least one selected from the group consisting of fullerene and a fullerene derivative. The first semiconductor region 31 includes, for example, fullerene ($C_{60}$). The second semiconductor region 32 includes, for example, at least one selected from the group consisting of quinacridone and a quinacridone derivative. The second semiconductor region 32 includes, for example, dimethylquinacridone (DMQA). Other examples of the intermediate layer 30 are described below.

In the embodiment, the ratio C2/C1 of the weight (C2) of the second semiconductor region 32 per unit volume in the intermediate layer 30 to the weight (C1) of the first semiconductor region 31 per unit volume in the intermediate layer 30 is greater than 5.

For example, a high photoelectric conversion efficiency is obtained by such a weight ratio. For example, the external quantum efficiency exceeds 100%. For example, a multiplication phenomenon occurs. According to the embodiment, a photoelectric conversion element can be provided in which it is possible to increase the sensitivity.

For example, in the case where the ratio C2/C1 is excessively low (e.g., 1), the concentration (the weight concentration) of the first semiconductor region 31 is the same as the concentration (the weight concentration) of the second semiconductor region 32. In such a case, it is considered that it is difficult for the multiplication phenomenon to occur because channels of the holes and the electrons are formed in these semiconductor regions; and the charge is transported to the electrodes via the channels.

Conversely, in the case where the ratio C2/C1 is high (e.g., greater than 5), the concentration (the weight concentration) of the first semiconductor region 31 is low compared to the concentration (the weight concentration) of the second semiconductor region 32. In such a case, the channels of the electrons are not formed in the semiconductor regions; the electrons are trapped in the semiconductor regions; and it is difficult for the electrons to move. A large electric field intensity is applied to the interfaces between the semiconductor and the electrodes due to the trapped electrons and the applied voltage from the outside; therefore, a large amount of holes is injected. Therefore, it is considered that the multiplication phenomenon occurs easily. It is considered that the multiplication phenomenon occurs easily in the case where the ratio C2/C1 is high.

In the embodiment, the ratio of the weight of the second semiconductor region 32 per unit volume to the weight of the first semiconductor region 31 per unit volume in the intermediate layer 30 may be not less than 100 and not more than 500.

Characteristics of the first semiconductor region 31 and the second semiconductor region 32 will now be described. First, the case where the first semiconductor region 31 is a fullerene derivative and the second semiconductor region 32 is a quinacridone derivative will be described.

Figure 2:
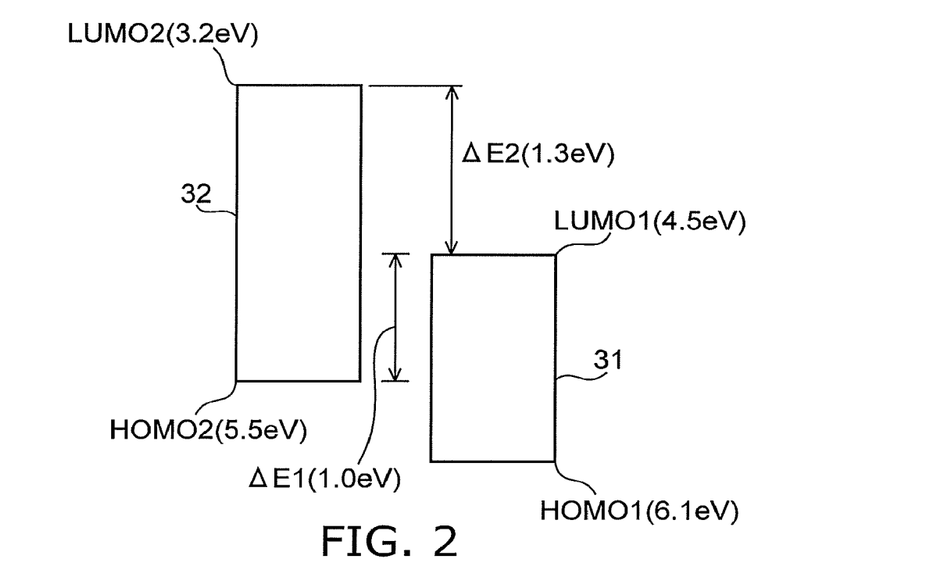
FIG. 2 is a schematic view illustrating characteristics of the photoelectric conversion element according to the first embodiment.

FIG. 2 is a schematic view illustrating characteristics of the photoelectric conversion element according to the first embodiment.

As shown in FIG. 2, the first semiconductor region 31 has a first highest occupied molecular orbit HOMO1 and a first lowest unoccupied molecular orbit LUMO1. The second semiconductor region 32 has a second highest occupied molecular orbit HOMO2 and a second lowest unoccupied molecular orbit LUMO2. For example, the value of the first highest occupied molecular orbit HOMO1 is greater than the value of the second highest occupied molecular orbit HOMO2. The value of the second highest occupied molecular orbit HOMO2 is greater than the value of the first lowest unoccupied molecular orbit LUMO1. The value of the first lowest unoccupied molecular orbit LUMO1 is greater than the value of the second lowest unoccupied molecular orbit LUMO2.

For example, in the case where the first semiconductor region 31 includes $C_{60}$, the first highest occupied molecular orbit HOMO1 is 6.1 eV; and the first lowest unoccupied molecular orbit LUMO1 is 4.5 eV. In the case where the second semiconductor region 32 includes DMQA, the second highest occupied molecular orbit HOMO2 is 5.5 eV; and the second lowest unoccupied molecular orbit LUMO2 is 3.2 eV. In such a case, the absolute value of a difference ΔE1 between the second highest occupied molecular orbit HOMO2 and the first lowest unoccupied molecular orbit LUMO1 is 1.0 eV. The absolute value of a difference ΔE2 between the second lowest unoccupied molecular orbit LUMO2 and the first lowest unoccupied molecular orbit LUMO1 is 1.3 eV.

In the embodiment, the absolute value of the difference ΔE1 between the second highest occupied molecular orbit HOMO2 and the first lowest unoccupied molecular orbit LUMO1 is 1.0 eV or more. The absolute value of the difference ΔE2 between the second lowest unoccupied molecular orbit LUMO2 and the first lowest unoccupied molecular orbit LUMO1 is 1.3 eV or more. In the case where materials having such a relationship are used, for example, a high photoelectric conversion efficiency is obtained. For example, the dark current can be suppressed. Experimental results relating to such materials will now be described.

In a first experiment, first to third samples SP1 to SP3 are made.

In the first sample SP1, phenyl-$C_{71}$-butyric-acid-methyl ester (P$C_{71}$BM) is used as the first semiconductor region 31; and poly(3-hexylthiophene) (P3HT) is used as the second semiconductor region 32. In the first sample SP1, the first highest occupied molecular orbit HOMO1 is 6.0 eV; and the first lowest unoccupied molecular orbit LUMO1 is 4.3 eV. The second highest occupied molecular orbit HOMO2 is 5.1 eV; and the second lowest unoccupied molecular orbit LUMO2 is 2.9 eV. In the first sample SP1, the absolute value of the difference 4E1 between the second highest occupied molecular orbit HOMO2 and the first lowest unoccupied molecular orbit LUMO1 is 0.8 eV. The absolute value of the difference ΔE2 between the second lowest unoccupied molecular orbit LUMO2 and the first lowest unoccupied molecular orbit LUMO1 is 1.4 eV.

In the second sample SP2, fullerene ($C_{60}$) is used as the first semiconductor region 31; and boron subphthalocyanine chloride (SubPC) is used as the second semiconductor region 32. In the second sample SP2, the first highest occupied molecular orbit HOMO1 is 6.1 eV; and the first lowest unoccupied molecular orbit LUMO1 is 4.5 V. The second highest occupied molecular orbit HOMO2 is 5.6 eV; and the second lowest unoccupied molecular orbit LUMO2 is 3.6 eV. In the second sample SP2, the absolute value of the difference 4E1 between the second highest occupied molecular orbit HOMO2 and the first lowest unoccupied molecular orbit LUMO1 is 1.1 eV. The absolute value of the difference ΔE2 between the second lowest unoccupied molecular orbit LUMO2 and the first lowest unoccupied molecular orbit LUMO1 is 0.9 eV.

In the third sample SP3, fullerene ($C_{60}$) is used as the first semiconductor region 31; and N,N'-dimethylquinacridone (DMQA) is used as the second semiconductor region 32. In the third sample SP3, the first highest occupied molecular orbit HOMO1 is 6.1 eV; and the first lowest unoccupied molecular orbit LUMO1 is 4.5 eV. The second highest occupied molecular orbit HOMO2 is 5.5 eV; and the second lowest unoccupied molecular orbit LUMO2 is 3.2 eV. In the third sample SP3, the absolute value of the difference 4E1 between the second highest occupied molecular orbit HOMO2 and the first lowest unoccupied molecular orbit LUMO1 is 1.0 eV. The absolute value of the difference ΔE2 between the second lowest unoccupied molecular orbit LUMO2 and the first lowest unoccupied molecular orbit LUMO1 is 1.3 eV.

In the first to third samples SP1 to SP3, the ratio C2/C1 of the weight (C2) of the second semiconductor region 32 per unit volume to the weight (C1) of the first semiconductor region 31 per unit volume is 100.

An external quantum efficiency EQE and the dark current are evaluated and measured for the first to third samples SP1 to SP3 recited above.

Figure 3:
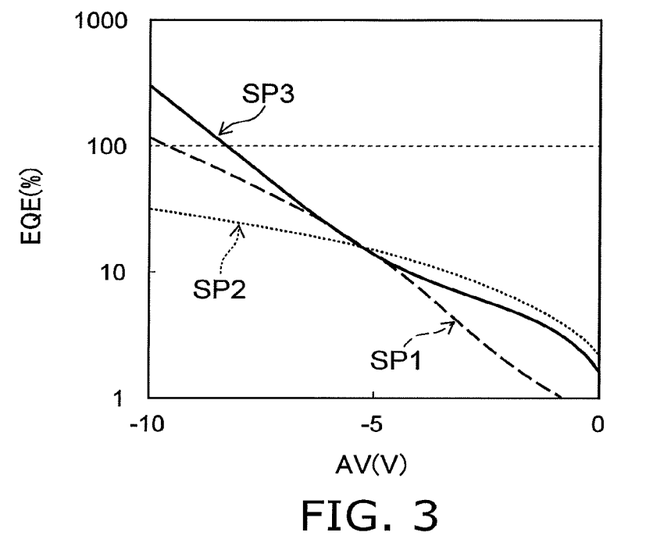
FIG. 3 is a graph illustrating a characteristic of the photoelectric conversion element.

FIG. 3 is a graph illustrating a characteristic of the photoelectric conversion element.

In FIG. 3, the horizontal axis is an applied voltage AV (V). The vertical axis is the external quantum efficiency EQE (%).

As shown in FIG. 3, compared to the first sample SP1 and the second sample SP2, a high external quantum efficiency EQE is obtained when the absolute value of the applied voltage AV is large for the third sample SP3. In the example, the external quantum efficiency EQE of the third sample SP3 is higher than the external quantum efficiency EQE of the first sample SP1 and the external quantum efficiency EQE of the second sample SP2 when the absolute value of the applied voltage AV is a prescribed value or more. In the example, the value recited above is about 5 V. In the example, the external quantum efficiency EQE of the third sample SP3 exceeds 100% when the absolute value of the applied voltage AV is a prescribed value or more (in the example, about 8 V). For example, a multiplication phenomenon occurs. $C_{60}$ and DMQA are combined in the third sample SP3. In this combination, the absolute value of the difference ΔE2 between the second lowest unoccupied molecular orbit LUMO2 and the first lowest unoccupied molecular orbit LUMO1 is large. Thereby, it is considered that in the first semiconductor region, the electrons are trapped easily; and the multiplication phenomenon occurs easily. For example, it is considered that a high external quantum efficiency EQE is obtained.

For example, it is considered that when the absolute value of the difference ΔE2 is small, for example, the electrons are not trapped easily; and, for example, the multiplication phenomenon does not occur easily.

Figure 4:
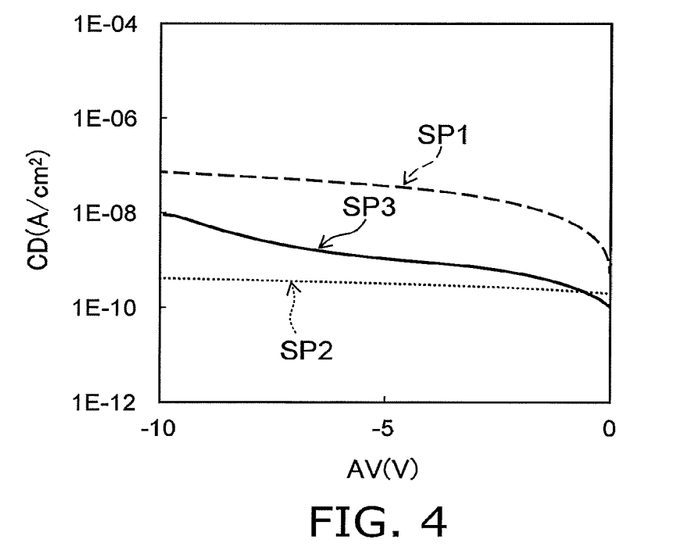
FIG. 4 is a graph illustrating a characteristic of the photoelectric conversion element.

FIG. 4 is a graph illustrating a characteristic of the photoelectric conversion element.

In FIG. 4, the horizontal axis is the applied voltage AV (V); and the vertical axis is a current density CD ($A/cm^2$). The current density CD is the density of the current flowing when shielded from light (when light or radiation is not irradiated).

As shown in FIG. 4, compared to the first sample SP1, the current density CD is low for the third sample SP3. In the third sample SP3, for example, the dark current is suppressed. $C_{60}$ and DMQA are combined in the third sample SP3. In this combination, the absolute value of the difference 4E1 between the second highest occupied molecular orbit HOMO2 and the first lowest unoccupied molecular orbit LUMO1 is large. Thereby, it is considered that the charge (e.g., the electrons) is not generated easily in the intermediate layer 30; and the dark current can be suppressed.

Thus, according to the embodiment, for example, a high photoelectric conversion efficiency is obtained. The dark current can be suppressed. According to the embodiment, a photoelectric conversion element can be provided in which it is possible to increase the sensitivity.

In the intermediate layer 30 recited above, for example, the ratio of the weight of the second semiconductor region 32 per unit volume to the weight of the first semiconductor region 31 per unit volume is obtained as follows. For example, the ratio of the weights can be obtained by dissolving the material used to form the intermediate layer 30 in an organic solvent, using liquid chromatography to separate into the material used to form the first semiconductor region 31 and the material used to form the second semiconductor region 32, subsequently causing the organic solvent to evaporate, and weighing each of the remaining materials on a balance.

For example, the information relating to the first highest occupied molecular orbit HOMO1, the first lowest unoccupied molecular orbit LUMO1, the second highest occupied molecular orbit HOMO2, and the second lowest unoccupied molecular orbit LUMO2 recited above is obtained as follows. For example, the intermediate layer 30 is dissolved by a solvent such as chlorobenzene, etc. The solution thus obtained is dried; and a solid substance is obtained. The solid substance is separated into the two components of the first semiconductor region 31 and the second semiconductor region 32 by using multiple solvents and by utilizing the difference between the solubilities. For each of the two components, a film of the component is formed on a substrate. For example, a method such as coating or the like is used to form the films. The two components are analyzed by measuring the absorption spectrum or the nuclear magnetic resonance spectrum. The energy levels of the first highest occupied molecular orbit HOMO1 and the second highest occupied molecular orbit HOMO2 are obtained by analyzing the films of the two components by photoelectron spectroscopy. On the other hand, the energy gap is calculated from the absorption wavelengths of the absorption spectra of the films of the two components. For one film, the first lowest unoccupied molecular orbit LUMO1 is derived from the sum of the energy gap and the value of the energy level of the first highest occupied molecular orbit HOMO1. For the other film, the second lowest unoccupied molecular orbit LUMO2 is derived from the sum of the energy gap and the value of the energy level of the second highest occupied molecular orbit HOMO2.

In the embodiment, the first semiconductor region 31 includes, for example, at least one selected from the group consisting of fullerene and a fullerene derivative. The first semiconductor region 31 includes, for example, at least one selected from the group consisting of fullerene ($C_{60}$), fullerene ($C_{70}$), phenyl-$C_{61}$-butyric-acid-methyl ester ($PC_{61}BM$), and $PC_{71}BM$.

In the embodiment, the second semiconductor region 32 includes, for example, at least one selected from the group consisting of quinacridone and a quinacridone derivative. The second semiconductor region 32 includes, for example, at least one selected from the group consisting of dimethylquinacridone (DMQA), dibutylquinacridone, dihexylquinacridone, and dioctylquinacridone.

In the embodiment, the first conductive layer 10 and the second conductive layer 20 include, for example, metal oxide films. These conductive layers may include, for example, metal films that transmit radiation. These conductive layers may include, for example, metal films that transmit visible light. These conductive layers include, for example, at least one selected from the group consisting of indium oxide, zinc oxide, tin oxide, indium tin oxide (ITO), and tin oxide including fluorine (FTO). These conductive layers may include, for example, at least one selected from the group consisting of gold, platinum, silver, copper, and aluminum. These conductive layers may include an alloy including at least one selected from the group consisting of gold, platinum, silver, copper, and aluminum.

In the embodiment, the substrate 50 includes, for example, at least one selected from the group consisting of glass, a resin, and a metal. The substrate 50 may transmit radiation. The substrate 50 may transmit visible light. The thickness of the substrate 50 is, for example, not less than 10 μm and not more than 10 cm.

For example, the first conductive layer 10 is formed on the substrate 50; and, for example, the material that is used to form the intermediate layer 30 is coated onto the first conductive layer 10. Subsequently, this material is solidified. Thereby, the intermediate layer 30 is obtained. For example, vapor deposition may be performed to form the intermediate layer 30. The second conductive layer 20 is formed on the intermediate layer 30. Thereby, the photoelectric conversion element 110 is obtained.

Figure 5:
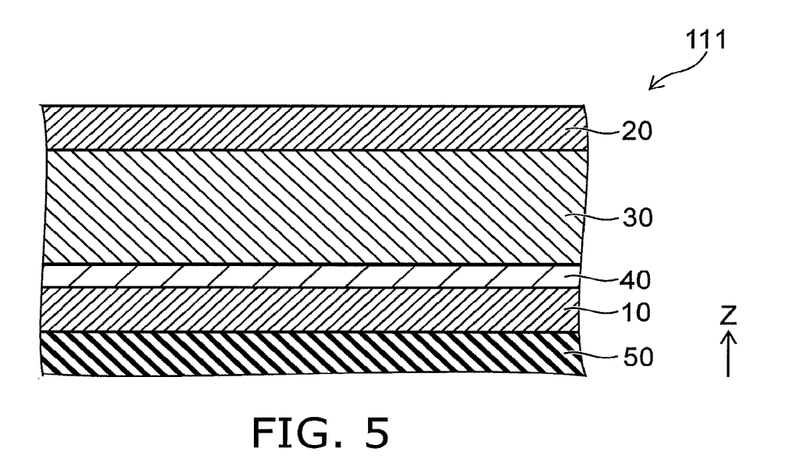
FIG. 5 is a schematic view illustrating another photoelectric conversion element according to the first embodiment.

FIG. 5 is a schematic view illustrating another photoelectric conversion element according to the first embodiment.

As shown in FIG. 5, the photoelectric conversion element 111 includes the first conductive layer 10, the second conductive layer 20, and the intermediate layer 30. In the example, a first layer 40 is provided between the first conductive layer 10 and the intermediate layer 30.

In the embodiment, for example, the first layer 40 contacts the first conductive layer 10. For example, the first layer 40 is electrically connected to the first conductive layer 10. The first layer 40 may include, for example, a mixture of poly(ethylenedioxythiophene) and poly(styrenesulfonic acid) (PEDOT:PSS). The first layer 40 may include, for example, at least one selected from the group consisting of a polythiophene polymer and a conductive material. For example, the conductivity of the first layer 40 is higher than the conductivity of the intermediate layer 30.

Second Embodiment

Figure 6:
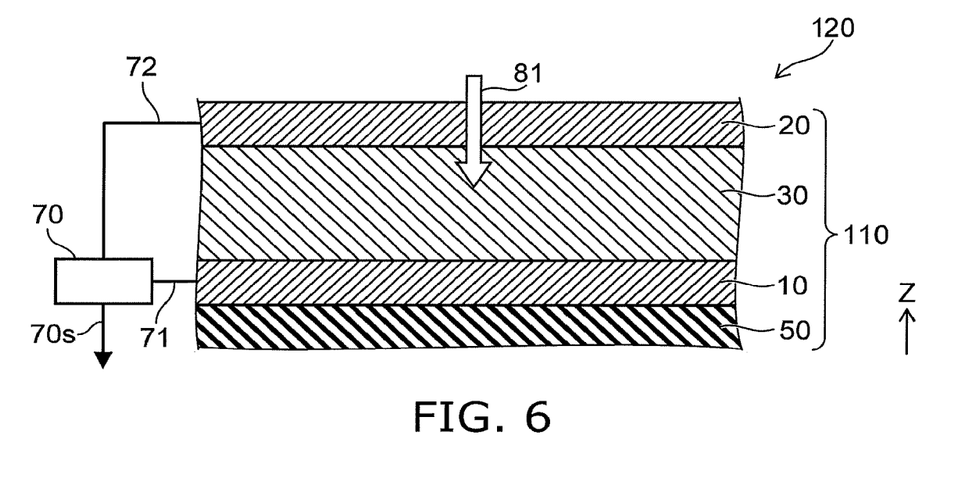
FIG. 6 is a schematic cross-sectional view illustrating a radiation detector according to a second embodiment.

FIG. 6 is a schematic cross-sectional view illustrating a radiation detector according to a second embodiment.

As shown in FIG. 6, the radiation detector 120 according to the second embodiment includes the photoelectric conversion element 110. The photoelectric conversion element 110 includes the first conductive layer 10, the second conductive layer 20, the intermediate layer 30, and the substrate 50.

As shown in FIG. 6, the radiation detector 120 includes a detection circuit 70. The detection circuit 70 is electrically connected to the first conductive layer 10 and the second conductive layer 20. For example, one end of a first interconnect 71 is electrically connected to the first conductive layer 10. The other end of the first interconnect 71 is connected to the detection circuit 70. For example, one end of a second interconnect 72 is electrically connected to the second conductive layer 20. The other end of the second interconnect 72 is connected to the detection circuit 70. These interconnects may be included in the photoelectric conversion element 110. The detection circuit 70 applies a bias voltage between the first conductive layer 10 and the second conductive layer 20.

Radiation 81 is incident on the photoelectric conversion element 110. At least one of the first conductive layer 10 or the second conductive layer 20 is transmissive to the radiation 81. In the example, the radiation 81 is incident on the intermediate layer 30 via the second conductive layer 20. A movable charge is generated in the intermediate layer 30 by excitation due to the radiation 81. The charge moves toward the first conductive layer 10 or the second conductive layer 20 due to the bias voltage. In the detection circuit 70, a signal (e.g., a current signal) due to the movement of the charge is detected. The detection circuit 70 is configured to output a signal 70s corresponding to the intensity of the radiation 81 incident on the photoelectric conversion element 110.

The radiation 81 includes, for example, at least one of α-rays, β-rays, or γ-rays.

Figure 7:
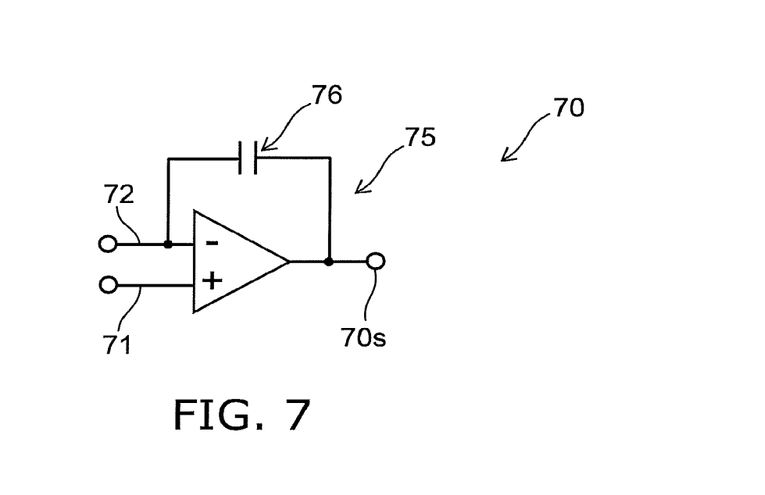
FIG. 7 is a circuit diagram illustrating a portion of the radiation detector according to the second embodiment.

FIG. 7 is a circuit diagram illustrating a portion of the radiation detector according to the second embodiment.

FIG. 7 illustrates a charge amplifier 75 provided in the detection circuit 70. The first interconnect 71 (the first conductive layer 10) is electrically connected to one of two input terminals of the charge amplifier 75. The second interconnect 72 (the second conductive layer 20) is electrically connected to the other of the two input terminals of the charge amplifier 75. A capacitance 76 is connected between the negative input of the charge amplifier 75 and the output terminal of the charge amplifier 75. For example, the voltage that corresponds to the charge generated between the first conductive layer 10 and the second conductive layer 20 is obtained as the signal 70s.

A resistor may be provided in parallel with the capacitance 76 in the charge amplifier 75. The input terminal of a reference voltage may be further provided.

Figure 8:
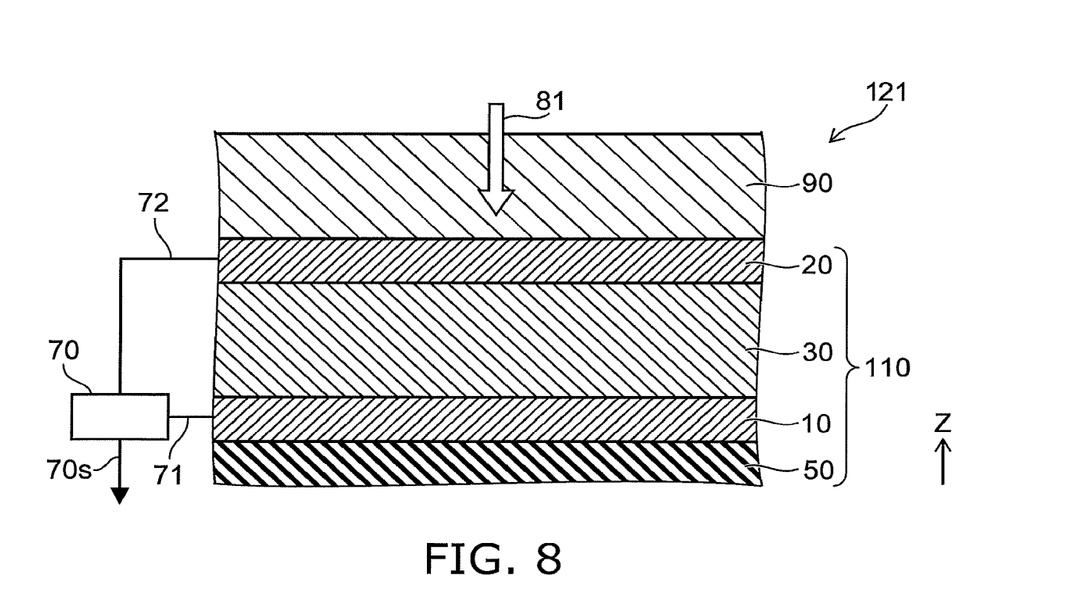
FIG. 8 is a schematic cross-sectional view illustrating another radiation detector according to the second embodiment.

FIG. 8 is a schematic cross-sectional view illustrating another radiation detector according to the second embodiment.

As shown in FIG. 8, the radiation detector 121 includes the photoelectric conversion element 110 and a scintillator 90. The photoelectric conversion element 110 includes the first conductive layer 10, the second conductive layer 20, the intermediate layer 30, and the substrate 50. The direction from the scintillator 90 toward the intermediate layer 30 is aligned with the direction from the first conductive layer 10 toward the second conductive layer 20.

In the embodiment, the scintillator 90 includes, for example, at least one selected from the group consisting of an inorganic scintillator, a plastic scintillator, and a liquid scintillator.

In the radiation detector 121, the radiation 81 is converted into an optical signal by the scintillator 90. The optical signal is converted by the photoelectric conversion element 110 into a signal (e.g., a current signal) due to the movement of the charge.

Figure 9:
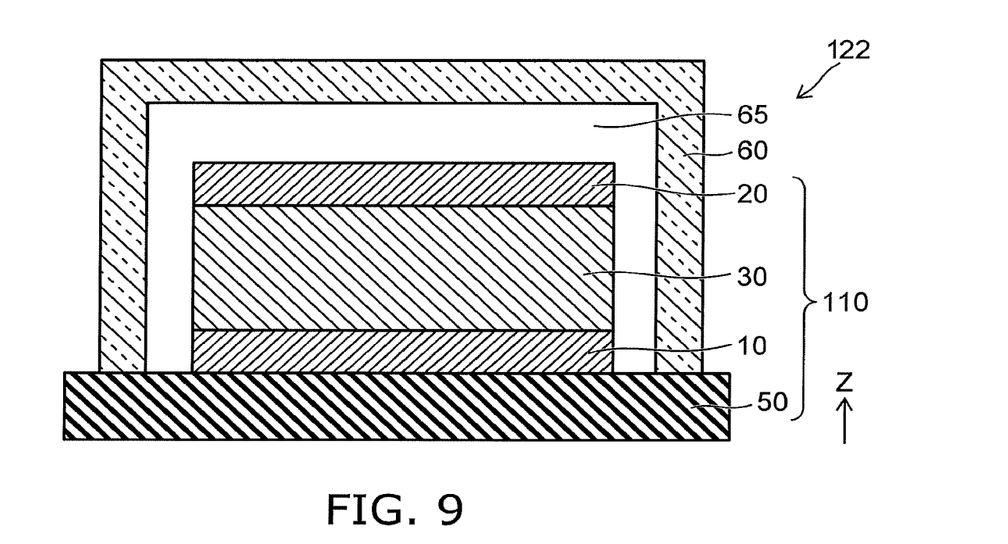
FIG. 9 is a schematic cross-sectional view illustrating another radiation detector according to the second embodiment.

FIG. 9 is a schematic cross-sectional view illustrating another radiation detector according to the second embodiment.

As shown in FIG. 9, the radiation detector 122 further includes a sealing member 60 in addition to the photoelectric conversion element 110. The photoelectric conversion element 110 includes the first conductive layer 10, the second conductive layer 20, the intermediate layer 30, and the substrate 50. The substrate 50 and the sealing member 60 include, for example, glass. The outer edge of the sealing member 60 is bonded to the outer edge of the substrate 50. The first conductive layer 10, the second conductive layer 20, and the intermediate layer 30 are provided in the space surrounded with the substrate 50 and the sealing member 60. The first conductive layer 10, the second conductive layer 20, and the intermediate layer 30 are sealed airtightly by the substrate 50 and the sealing member 60. Thereby, stable characteristics are obtained easily. High reliability is obtained.

Figure 10:
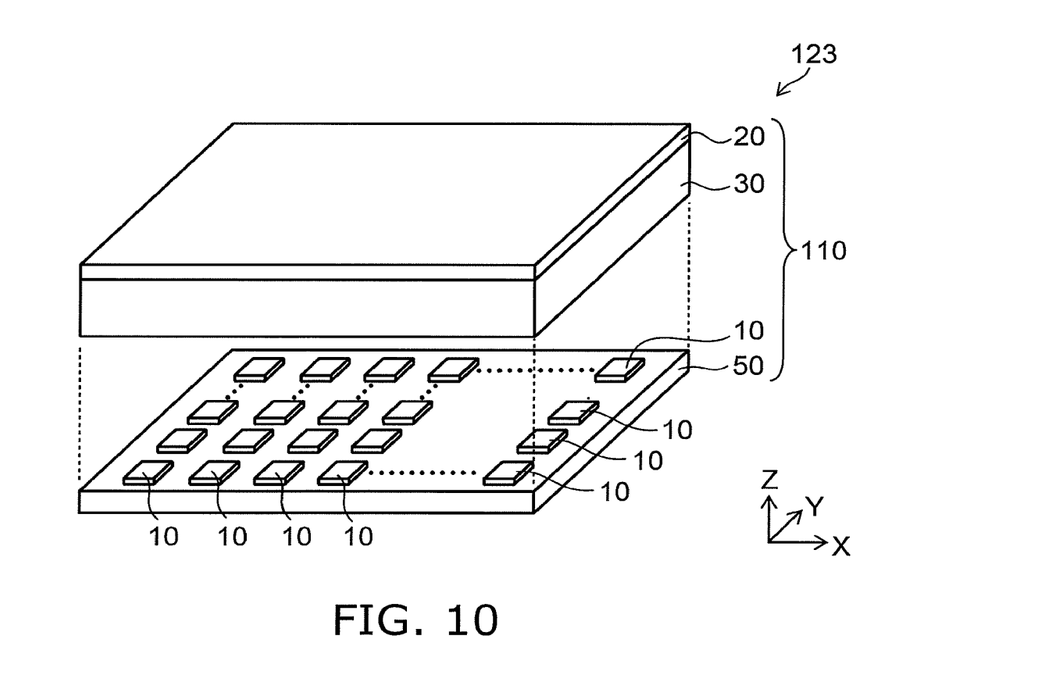
FIG. 10 is a schematic cross-sectional view illustrating another radiation detector according to the second embodiment.

A space 65 is provided between the sealing member 60 and each of the first conductive layer 10, the second conductive layer 20, and the intermediate layer 30. For example, an inert gas (e.g., nitrogen gas or the like) is sealed in the space 65. FIG. 10 is a schematic cross-sectional view illustrating another radiation detector according to the second embodiment.

As shown in FIG. 10, the radiation detector 123 includes the photoelectric conversion element 110. The photoelectric conversion element 110 includes the first conductive layer 10, the second conductive layer 20, the intermediate layer 30, and the substrate 50. In FIG. 10, some of the components included in the radiation detector 123 are drawn as being separated from each other for easier viewing of the drawing.

Multiple first conductive layers 10 are provided in the radiation detector 123. The multiple first conductive layers 10 are arranged along a plane (e.g., the X-Y plane) crossing the direction (the Z-axis direction) from one of the multiple first conductive layers 10 toward the second conductive layer 20. The X-Y plane is perpendicular to the Z-axis direction.

For example, the multiple first conductive layers 10 are arranged along the X-axis direction and the Y-axis direction. For example, the multiple first conductive layers 10 are arranged in a matrix configuration.

For example, the radiation detector according to the embodiment can be utilized as a β-ray detector. For example, β-rays are converted into charge in the β-ray detector.

According to the embodiments, a radiation detector can be provided in which it is possible to increase the sensitivity.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor or the like) is provided in a path between two conductors, and a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive layers, intermediate layers, substrates, first semiconductor regions, second semiconductor regions, detection circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all photoelectric conversion elements, and radiation detectors practicable by an appropriate design modification by one skilled in the art based on the photoelectric conversion elements, and the radiation detectors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A photoelectric conversion element, comprising:
   a first conductive layer;
   a second conductive layer; and
   an intermediate layer provided between the first conductive layer and the second conductive layer,
   the intermediate layer including a plurality of first semiconductor regions and a second semiconductor region, each of the first semiconductor regions being of an n-type, the second semiconductor region being of a p-type, the second semiconductor region being provided around at least a part of the first semiconductor regions, one of the first semiconductor regions being apart from an other one of the first semiconductor regions, and a part of the second semiconductor region being located between the one of the first semiconductor regions and the other one of the first semiconductor regions,
   each of the first semiconductor regions including at least one selected from the group consisting of fullerene and a fullerene derivative,
   the second semiconductor region including at least one selected from the group consisting of quinacridone and a quinacridone derivative, and
   a ratio of a weight of the second semiconductor region per unit volume to a weight of the first semiconductor regions per unit volume in the intermediate layer being not less than 100 and not more than 500.

2. The element according to claim 1, further comprising a substrate, the first conductive layer being provided between the substrate and the intermediate layer.

3. The element according to claim 1, further comprising a first layer provided between the first conductive layer and the intermediate layer,
   a conductivity of the first layer being higher than a conductivity of the intermediate layer.

4. A radiation detector, comprising a photoelectric conversion element and a detection circuit, the photoelectric conversion element comprising:
   a first conductive layer;
   a second conductive layer; and
   an intermediate layer provided between the first conductive layer and the second conductive layer,
   the intermediate layer including a plurality of first semiconductor regions and a second semiconductor region, each of the first semiconductor regions being of an n-type, the second semiconductor region being of a p-type, the second semiconductor region being provided around at least a part of the first semiconductor regions, one of the first semiconductor regions being apart from an other one of the first semiconductor regions, and a part of the second semiconductor region being located between the one of the first semiconductor regions and the other one of the first semiconductor regions, each of the first semiconductor regions including at least one selected from the group consisting of fullerene and a fullerene derivative, the second semiconductor region including at least one selected from the group consisting of quinacridone and a quinacridone derivative, a ratio of a weight of the second semiconductor region per unit volume to a weight of the first semiconductor regions per unit volume in the intermediate layer being not less than 100 and not more than 500, the detection circuit being electrically connected to the first conductive layer and the second conductive layer, and the detection circuit being configured to apply a voltage between the first conductive layer and the second conductive layer to output a signal corresponding to an intensity of radiation incident on the photoelectric conversion element, an external quantum efficiency exceeding 100% at an applied voltage of −10V.

5. The detector according to claim 4, further comprising a scintillator,
a direction from the scintillator toward the intermediate layer being aligned with a direction from the first conductive layer toward the second conductive layer.

6. The detector according to claim 4, wherein the radiation includes β-rays.

7. A photoelectric conversion element, comprising:
a first conductive layer;
a second conductive layer; and
an intermediate layer provided between the first conductive layer and the second conductive layer,
the intermediate layer including a plurality of first semiconductor regions and a second semiconductor region, each of the first semiconductor regions being of an n-type, the second semiconductor region being of a p-type, the second semiconductor region being provided around at least a part of the first semiconductor regions, one of the first semiconductor regions being apart from an other one of the first semiconductor regions, and a part of the second semiconductor region being located between the one of the first semiconductor regions and the other one of the first semiconductor regions,
each of the first semiconductor regions having a first highest occupied molecular orbit and a first lowest unoccupied molecular orbit,
the second semiconductor region having a second highest occupied molecular orbit and a second lowest unoccupied molecular orbit,
the absolute value of a difference between the second highest occupied molecular orbit and the first lowest unoccupied molecular orbit being 1.0 eV or more,
the absolute value of a difference between the second lowest unoccupied molecular orbit and the first lowest unoccupied molecular orbit being 1.3 eV or more, and
a ratio of a weight of the second semiconductor region per unit volume to a weight of the first semiconductor regions per unit volume in the intermediate layer being not less than 100 and not more than 500.

8. The element according to claim 7, further comprising a substrate,
the first conductive layer being provided between the substrate and the intermediate layer.

9. The element according to claim 7, further comprising a first layer provided between the first conductive layer and the intermediate layer,
a conductivity of the first layer being higher than a conductivity of the intermediate layer.

10. A radiation detector, comprising a photoelectric conversion element and a detection circuit, the photoelectric conversion element comprising:
a first conductive layer,
a second conductive layer; and
an intermediate layer provided between the first conductive layer and the second conductive layer,
the intermediate layer including a plurality of first semiconductor regions and a second semiconductor region, each of the first semiconductor regions being of an n-type, the second semiconductor region being of a p-type, the second semiconductor region being provided around at least a part of the first semiconductor regions, one of the first semiconductor regions being apart from an other one of the first semiconductor regions, and a part of the second semiconductor region being located between the one of the first semiconductor regions and the other one of the first semiconductor regions,
each of the first semiconductor region having a first highest occupied molecular orbit and a first lowest unoccupied molecular orbit,
the second semiconductor region having a second highest occupied molecular orbit and a second lowest unoccupied molecular orbit,
the absolute value of a difference between the second highest occupied molecular orbit and the first lowest unoccupied molecular orbit being 1.0 eV or more,
the absolute value of a difference between the second lowest unoccupied molecular orbit and the first lowest unoccupied molecular orbit being 1.3 eV or more,
a ratio of a weight of the second semiconductor region per unit volume to a weight of the first semiconductor regions per unit volume in the intermediate layer being not less than 100 and not more than 500,
the detection circuit being electrically connected to the first conductive layer and the second conductive layer, and
the detection circuit being configured to apply a voltage between the first conductive layer and the second conductive layer to output a signal corresponding to an intensity of radiation incident on the photoelectric conversion element, an external quantum efficiency exceeding 100% at an applied voltage of −10V.

11. The detector according to claim 10, further comprising a scintillator,
a direction from the scintillator toward the intermediate layer being aligned with a direction from the first conductive layer toward the second conductive layer.

12. The detector according to claim 10, wherein the radiation includes β-rays.

* * * * *